United States Patent
Ramanan et al.

(10) Patent No.: US 11,145,382 B1
(45) Date of Patent: Oct. 12, 2021

(54) NON-VOLATILE MEMORY WITH A WELL BIAS GENERATION CIRCUIT

(71) Applicant: NXP USA, Inc., Austin, TX (US)

(72) Inventors: Karthik Ramanan, Austin, TX (US); Jon Scott Choy, Austin, TX (US); Jacob T. Williams, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/871,320

(22) Filed: May 11, 2020

(51) Int. Cl.
| | |
|---|---|
| *G11C 29/12* | (2006.01) |
| *G11C 29/02* | (2006.01) |
| *G11C 11/4091* | (2006.01) |
| *G11C 11/4074* | (2006.01) |
| *G11C 5/14* | (2006.01) |
| *G11C 13/00* | (2006.01) |
| G11C 29/50 | (2006.01) |

(52) U.S. Cl.
CPC ........ *G11C 29/12005* (2013.01); *G11C 5/146* (2013.01); *G11C 11/4074* (2013.01); *G11C 11/4091* (2013.01); *G11C 13/003* (2013.01); *G11C 29/021* (2013.01); *G11C 2013/0045* (2013.01); *G11C 2013/0078* (2013.01); *G11C 2029/5006* (2013.01)

(58) Field of Classification Search
CPC .......... G11C 29/12005; G11C 11/4074; G11C 29/021; G11C 11/4091; G11C 2029/5006; G11C 5/146; G11C 13/003; G11C 2013/0078; G11C 2013/0045
See application file for complete search history.

(56) References Cited

U.S. PATENT DOCUMENTS

| 5,335,198 A * | 8/1994 | Van Buskirk | G11C 16/28 365/185.09 |
| 5,351,214 A * | 9/1994 | Rouy | G11C 29/02 365/185.21 |
| 5,650,966 A * | 7/1997 | Cleveland | G11C 16/28 365/185.2 |
| 6,496,054 B1 * | 12/2002 | Prather | H03K 19/00315 327/534 |

(Continued)

OTHER PUBLICATIONS

Arnaud et al.: "Truly Innovative 28nm FDSOI Technology for Automotive Microcontroller Applications embedding 16MB Phase Change Memory", IEDM conference, Dec. 3-5, 2018, San-Francisco, CA, pp. 1-39.

(Continued)

*Primary Examiner* — Jay W. Radke

(57) ABSTRACT

A leakage measuring circuit includes a bias input node control circuit and provides a signal indicative of a leakage current through the bias input node. The bias input node control circuit includes a first input to receive an indication of a reference voltage, a second input to receive an indication of a voltage of the bias input node, and an output to bias the bias input node at the reference voltage based on a relationship between the first and second input. A well voltage bias circuit provides a well bias voltage and includes a well bias control circuit including a first input to receive the signal indicative of the leakage current, a second input to receive a signal indicative of a reference leakage current (Continued)

value, and an output for controlling the well bias voltage based on a relationship between the first and second input of the well bias control circuit.

20 Claims, 3 Drawing Sheets

(56) References Cited

U.S. PATENT DOCUMENTS

| | | | |
|---|---|---|---|
| 7,453,311 B1* | 11/2008 | Hart | G05F 3/242 |
| | | | 327/534 |
| 8,106,458 B2 | 1/2012 | Cai et al. | |
| 9,734,882 B2 | 8/2017 | Toh et al. | |
| 10,102,895 B1 | 10/2018 | Li et al. | |
| 10,453,532 B1* | 10/2019 | Antonyan | G11C 16/10 |
| 2004/0027907 A1* | 2/2004 | Ooishi | G11C 11/15 |
| | | | 365/226 |
| 2004/0036525 A1* | 2/2004 | Bhagavatheeswaran | |
| | | | H02M 3/07 |
| | | | 327/534 |
| 2006/0220726 A1* | 10/2006 | Ward | H03K 19/0016 |
| | | | 327/534 |
| 2007/0146049 A1* | 6/2007 | Sumita | H03K 19/0013 |
| | | | 327/534 |
| 2013/0334897 A1* | 12/2013 | Baumann | G11C 7/24 |
| | | | 307/116 |
| 2016/0125937 A1* | 5/2016 | Kang | G11C 13/0038 |
| | | | 365/148 |
| 2016/0125940 A1* | 5/2016 | Kang | G11C 13/004 |
| | | | 365/148 |
| 2016/0172059 A1* | 6/2016 | Arslan | G11C 13/004 |
| | | | 365/148 |
| 2019/0066748 A1* | 2/2019 | Lee | G11C 11/161 |
| 2020/0090724 A1* | 3/2020 | Antonyan | G11C 11/1697 |

OTHER PUBLICATIONS

U.S. Appl. No. 16/507,691, Ramanan, Karthik: "Reference Generation for Voltage Sensing in a Resistive Memory", filed Jul. 10, 2019.

U.S. Appl. No. 16/668,206, Williams et al.: "Non-Volatile Memory With a Select Gate Regulator Circuit", filed Oct. 30, 2019.

* cited by examiner

NON-VOLATILE MEMORY WITH A WELL BIAS GENERATION CIRCUIT

BACKGROUND OF THE INVENTION

Field of the Invention

This invention relates to non-volatile memories.

Background

Non-volatile memories are utilized for storing data in an electronic system including when the systems are powered down, since the bit cells hold their states. One type of non-volatile memory is a resistive memory, in which each bit cell of a resistive memory includes a resistive storage element which is in either a high resistive state (HRS) or a low resistive state (LRS), depending on the logic state of the bit cell. A resistive memory can be a magnetoresistive random access memory (MRAM) which may be implemented in fully-depleted silicon-on-insulator (FDSOI) technology. In the case of MRAMs in FDSOI technology, fixed negative well biasing has been used to minimize leakage currents during read operations, especially at higher temperatures. However, this negative well biasing adversely affects the drive strength of a bit cell which limits the amount of write current flowing during write operations which results in write failures, especially at cold temperatures when there is no leakage. Therefore, a need exists for an improved way to address well biasing which allows for both improved read and write operations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As discussed above, in the case of resistive memories, such as MRAM in FDSOI technology, negative well biasing can be used to minimize leakage during read operations. However, in situations where there is little to no leakage, such as at cold temperatures, the negative well biasing used for the resistive memory array negatively impacts the drive strength which limits the amount of write current which can flow through a bit cell during a write operation. This results in unacceptable levels of write failures. Therefore, in one aspect, an adaptive well biasing technique is used which allows the resistive memory array to have the optimal well bias level such that neither read nor write operations are compromised or negatively impacted. This may result in improved performance of both reads and writes over a wide range of temperatures. The adaptive well biasing is performed by a well bias generation circuit which includes a leakage current measuring circuit which provides an indication of the amount of leakage current in the resistive memory array, and a well voltage bias circuit which, based on the indication of the amount of leakage current, generates the appropriate well bias level which is provided to the body terminals or wells of each bit cell of the resistive memory array.

Figure 1:
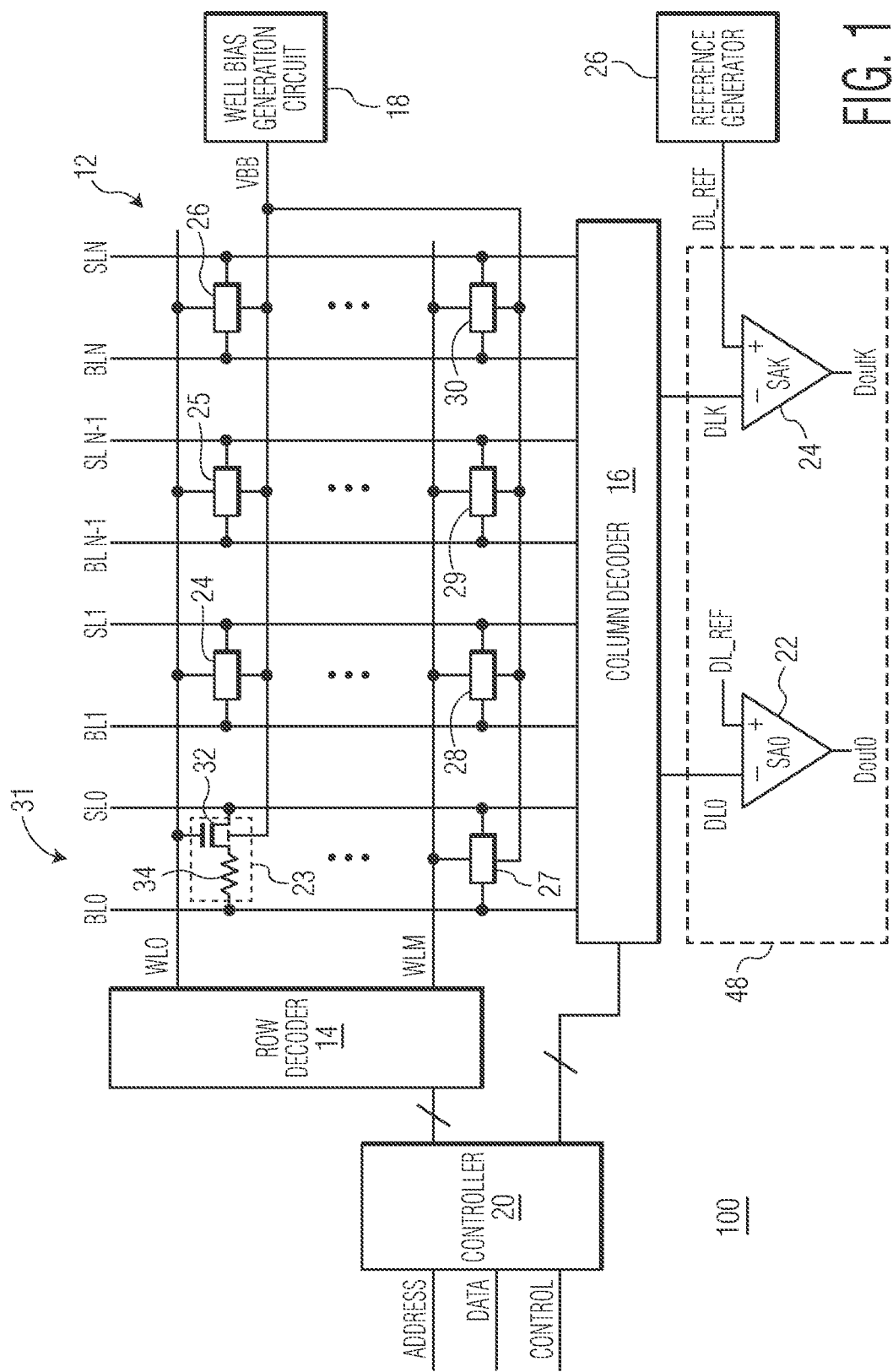
FIG. 1 is a circuit diagram of a non-volatile memory circuit according to one embodiment of the present invention.

FIG. 1 shows a circuit diagram of a non-volatile memory circuit 100 according to one embodiment of the present invention. Memory circuit 100 includes an array 12 of non-volatile memory cells (e.g. 23-30). In one embodiment, the memory cells of array 12 are characterized as resistive memory cells with a select transistor (e.g. 32) and a resistive storage element (e.g. 34). Types of resistive memory cells include MRAM, ReRAM, carbon nanotube, and phase change memory cells. In MRAM resistive memory cells, the resistive storage element may be implemented by a magnetic tunnel junction (MTJ), therefore, each bit cell may be described as including a select transistor (e.g. 32) and an MTJ (e.g. 34). Note that in the illustrated embodiments, the select gate transistors are N-type metal-oxide-semiconductor (NMOS) transistors. Furthermore, the select gate transistors may be implemented in FDSOI technology in which each select transistor is formed on and within a semiconductor layer of a semiconductor-on-insulator (SOT) substrate (e.g. the silicon layer of a silicon-on-insulator substrate). The semiconductor layer is on an insulator layer, which may be a buried oxide layer, or BOX. Note that "SOT" may be used to refer to either semiconductor-on-insulator or the more specific, silicon-on-insulator. With FDSOI technology, the source and drain regions of each select transistor are fully depleted in that they extend down fully through the semiconductor layer to the underlying insulator layer. The portion of the semiconductor layer between the source and drain regions of a transistor (beneath the channel region and above the buried oxide) is referred to as the well or body region of the transistor. Therefore, each select transistor includes four electrodes (or terminals): a source, a drain, a gate, and a well (also referred to as a body).

The memory cells of array 12 are arranged in rows and columns. Each cell of a row is coupled to a corresponding word line of WL0-WLM for controlling the select transistor (e.g. 32) of the cell to access the resistive storage element (e.g. 34) of the cell during a memory operation. The word lines are controlled by a row decoder 14 which asserts a selected one of the word lines based on a first portion of an access address (ADDRESS) received by a controller 20 of memory circuit 100 for the memory operation. Array 12 includes M+1 number of rows with 2 rows being shown in FIG. 1. However, an array may include a different number of rows in other embodiments For example, an 8 Mb memory array may have 2048 rows plus a few (e.g., 2 or 4) redundant rows.

In the embodiment shown, the cells of each column of array 12 are coupled to a corresponding word line of WL0-WLM, a corresponding source line of SL0-SLN, and a corresponding bit line of BL0-BLN. For example, in bit cell 23, MTJ 34 has a first terminal coupled to corresponding bit line BL0 and a second terminal coupled to a first current electrode (e.g. drain) of select transistor 32. A control electrode (e.g. gate) is coupled to corresponding word line, WL0, and a second current electrode (e.g. source) is coupled to corresponding source line, SL0. A body terminal or well of each select transistor of array 12 is coupled to a well bias node to receive a well bias voltage, VBB. Array 12 includes N+1 source lines and N+1 bit lines, in which FIG. 1 illustrates four source lines (e.g. SL0, SL1, SLN−1, and SLN) and four bit lines (e.g. BL0, BL1, BLN−1, and BLN). However, array 12 may have a different number source lines and bit lines in other embodiments. In other embodiments, an array may include a source line paired with two bit lines or other combinations of bit lines per source line.

In the embodiment shown, memory circuit 100 includes a column decoder 16 for selecting a subset of the bit lines or source lines to provide to read circuitry 48 as read data lines (DL0-DLK) of memory circuit 100 during a memory read operation. Note that DL0-DLK may correspond to a subset of the source lines (SL0-SLN) or a subset of the bit lines (BL0-BLN). In one embodiment, circuitry within column decoder 16 routes either the selected subset of bit lines or the selected subset of source lines out as the read data lines to be sensed for the read operation. Read circuitry 48 includes K+1 sense amplifiers (e.g. 22, 24), coupled to each of the K+1 read data lines DL0-DLK. Reference generator 26 provides a read data line reference (DL_REF) to each sense amplifier in read circuitry 48. During a read operation, the sense amplifiers output the read data output, Dout0-DoutK, which corresponds to the stored value in the selected memory cells (i.e. data cells). To generate the read data output, each sense amplifier compares a corresponding read data line (provided to a data input of the sense amplifier) with DL_REF (provided to a reference input of the sense amplifier), such that the corresponding read data output is a first logic state if a voltage of the corresponding read data line is greater than DL_REF, and a second logic state otherwise. Note that additional circuitry, such as biasing circuitry, may be present in read circuitry 48 to implement the sensing function of DL0-DLK to provide Dout0-DoutK. Also, either voltage or current may be sensed to provide Dout0-DoutK.

Decoder 16 selects K+1 number of selected bit lines and selected source lines based on a second portion of the address received by controller 20 for the memory operation. In one embodiment, the ratio of N+1 to K+1 is 8 to 1, but may be of other ratios in other embodiments. Some embodiments do not include a column decoder in which BL0-BLN or SL0-SLN are provided to N+1 sense amplifiers. Note that the write circuitry of memory circuit 100, coupled to the selected bit lines and source lines for receiving corresponding K+1 input data lines during a memory write operation of write data to the indicated access address is not illustrated for simplicity. Note that controller 20, in addition to receiving ADDRESS, receives the write data as DATA for write operations, and control signals received by controller 20 may include a R/W indicator to indicate whether a write memory operation or a read memory operation is being performed.

In one embodiment of a resistive memory array, when current flows through the resistive storage element of a memory cell in a first direction, the memory cell is written to a low resistive state (LRS) in which the magnetic moments of the interacting magnetic layers of the MTJ are aligned in the same direction, and when current flows in a second direction, opposite the first direction, through the resistive storage element, the memory cell is written to a high resistive state (HRS) in which the magnetic moments of the interacting magnetic layers of the MTJ are not aligned in the same direction. In one embodiment, a HRS corresponds to a logic level one and a LRS corresponds to a logic level low. However, in alternate embodiments, the LRS may correspond to the logic level high and the HRS to the logic level low. In one embodiment, the resistance of the HRS is 2-3 times the resistance of the LRS, in which the resistance of the LRS may be in a range of 2 k-8 k Ohms. Therefore, reference generator 26 generates DL_REF for read operations such that the voltage level of DL_REF falls between a voltage over the MTJ corresponding to the HRS and the LRS in order to distinguish between the logic levels.

Figure 2:
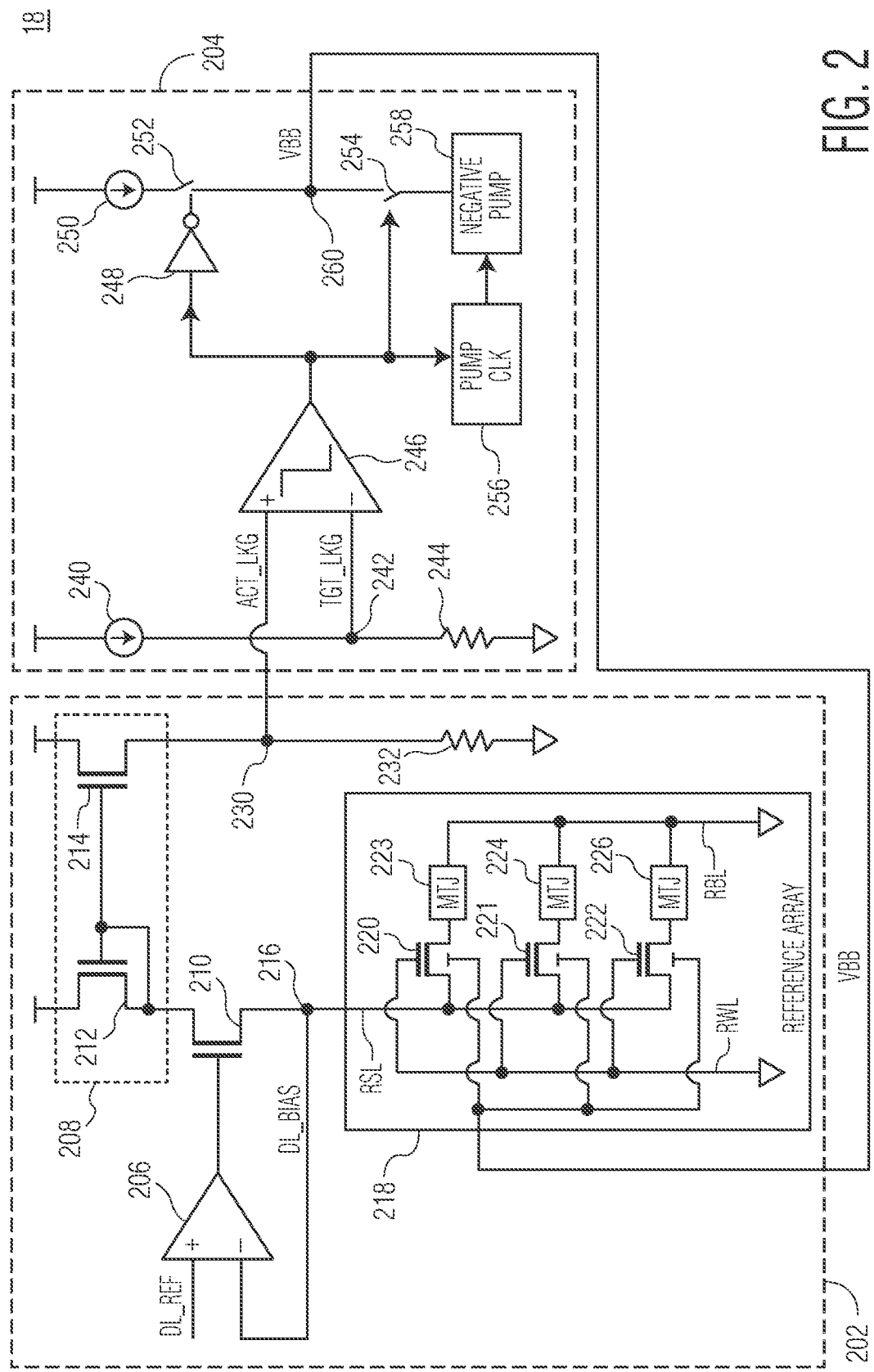
FIG. 2 is a circuit diagram of a well bias generation circuit of the non-volatile memory circuit of FIG. 1, according to one embodiment of the present invention.

FIG. 2 illustrates, in partial block diagram form and partial schematic form, a more detailed view of well bias generation circuit 18 in accordance to one embodiment of the present invention. Circuit 18 includes a leakage current measurement circuit 202 coupled to a well voltage bias circuit 204. Circuit 202 includes an amplifier 206, an NMOS transistor 210, P-type metal-oxide-semiconductor (PMOS) transistors 212 and 214 (which form a current mirror 208), a reference array circuit 218, and a resistor 232. A non-inverting input of amplifier 206 is coupled to receive DL_REF, and an inverting input of amplifier 206 is coupled to a circuit node 216 (also referred to as bias input node 216), and an output of amplifier 206 is coupled to a control electrode of transistor 210. DL_REF is a reference voltage used during a read operation of array 12. In one embodiment, DL_REF is received from reference generator 26 and is the same reference voltage provided to the sense amplifiers of read circuitry 48. Alternatively, it can be generated by other circuitry to provide a value similar to DL_REF generated by reference generator 26. A first current electrode of transistor 210 is coupled to current mirror 208 and a second current electrode of transistor 210 is coupled to bias input node 216. Note that amplifier 206 and transistor 210 are coupled in a source-follower configuration with the second current electrode of transistor 210 coupled to the inverting input of amplifier 206 via circuit node 216.

Still referring to FIG. 2, transistor 212 of current mirror 208 has a first current electrode coupled to a first power supply voltage terminal, a second current electrode coupled to the first current electrode of transistor 210, and a gate electrode coupled to the second current electrode of transistor 212. Transistor 214 of current mirror 208 has a first current electrode coupled to the first power supply voltage, a second current electrode coupled to a first terminal of resistor 232, and a control electrode coupled to the control electrode of transistor 212. A second terminal of resistor 232 is coupled to a second power supply voltage terminal. The first power supply voltage terminal receives a first supply voltage which is greater than a second power supply voltage received by the second power supply voltage terminal. In one embodiment, the first supply voltage is VDD and the second supply voltage is VSS, in which VSS may be, for example, ground or 0V. An output of leakage current measurement circuit 202 is provided at output node 230 at an output of current mirror 208 (i.e. at the second current electrode of transistor 214).

Reference array 218 is coupled to circuit node 216. Reference array 218 is a reference circuit which is configured to emulate leakage current of memory array 12. Therefore, in the illustrated embodiment, reference array 218 includes circuit elements which are similar in size, type, and connectivity to a column of array 12, such as column 31 of FIG. 1. Therefore, transistor 220 together with MTJ 223 is similar to select transistor 32 and MTJ 34 of bit cell 23. Likewise, transistor 222 with MTJ 226 is similar to bit cell 27 of array 12. The body terminal or well of each transistor in reference array 218 is also coupled to the well bias node to receive VBB. The control gates of the transistors are all coupled to a reference word line (RWL), the MTJs are all coupled to a reference bit line (RBL), and the first current electrode (e.g. source) of all the transistors are coupled to a reference source line (RSL), in which circuit node 216 is a node of the RSL and thus is part of a current path of circuit 218 which emulates a source line of array 12. In circuit 218, each of the RWL and the RBL are coupled to VSS. Note that in alternate embodiments, node 216 can be in a different current path of circuit 218, such as in the RBL, depending on where in array 12 the leakage current needs to be measured.

In operation, amplifier 206 and transistor 210, being in a source-follower configuration, control the voltage at node 216, DL_BIAS, to match DL_REF. In this manner, node 216 is biased at the voltage level of DL_REF based on the relationship between DL_REF and DL_BIAS. The purpose of reference array 218 is to emulate the leakage current in array 12 during a read operation of array 12 during which DL_REF is used. Therefore, with each of RWL and RBL coupled to VSS, the only current through circuit node 216 should be the leakage current on the RSL. The wells of reference array 218 also receive VBB, just as the wells of array 12. Due to the similarities of reference array 218 compared to a column of array 12, including setting the appropriate voltage values (e.g. setting node 216 to DL_REF and the well terminals to VBB), the leakage current through node 216 should be substantially similar to the leakage current in array 12 during a read. That is, the leakage current through 216 is a close approximation within an acceptable range to the actual leakage current in array 12. Current mirror 208 mirrors this leakage current through node 216 and provides it at output 230. In this manner, leakage current measurement circuit 202 forces a voltage on node 216 in order to measure the resulting leakage current through transistor 214. Output 230 of circuit 202 provides a signal, ACT_LKG, which is indicative of a leakage current through bias input node 216 (and thus indicative of an actual leakage current in array 12 during a read operation).

In one embodiment, reference array 218 is the same in terms of number of circuit elements, type, size, and material as a column in array 12. In an alternate embodiment, reference array 218 may be implemented as more, fewer, or different circuit elements which, when DL_REF is applied, would also achieve a leakage current similar to that of array 12 during a read operation.

Well voltage bias circuit 204 is coupled to output node 230 of leakage current measurement circuit 202 to receive the signal indicative of the leakage current in array 12, ACT_LKG. Well voltage bias circuit 204 uses this indication of leakage current to adjust VBB accordingly, which can range from negative voltage level (a voltage below VSS, such as −1.5V) up to VDD, depending on the leakage current in array 12. Well voltage bias circuit 204 includes a digital voltage comparator 246, pull-up current sources 240 and 250, an inverter 248, switches 252 and 254, a pump clock 256, and a negative charge pump 258. Note that negative charge pump 258 can be implemented using any type of negative charge pump which can provide a negative voltage value (i.e. a voltage below VSS). Each of switches 252 and 254 includes a first current terminal, a second current terminal, and a control terminal, in which, when a signal provided to the control terminal is asserted, the switch is closed (e.g. placed in a conductive state), such that current flows between the first and second current terminals, and when the signal is negated or deasserted, the switch is open (e.g. placed in a non-conductive state), such that current does not flow between the first and second current terminals. Note that any type of switch or circuits may be used to implement switches 252 and 254.

Comparator 246 has a non-inverting input coupled to node 230 of circuit 202 to receive ACT_LKG, and an inverting input to receive a reference leakage current value, TGT_LKG. An output of comparator 246 is coupled to an input of inverter 248, an input of pump clock 256, and a control input of switch 254. An output of inverter 248 is coupled to a control input of switch 252. A first terminal of current source 250 is coupled to VDD and a second terminal is coupled to a first current terminal of switch 252. A second current terminal of switch 252 is coupled to a first current terminal of switch 254 and also to well bias node 260 (also referred to as an output node) which provides VBB as the output of well voltage bias circuit 204. Negative pump 258 has an input coupled to pump clock 256 and is also coupled to a second current terminal of switch 254. A first terminal of current source 240 is coupled to VDD and a second terminal of current source 240 is coupled to a circuit node 242. A first terminal of resistor 244 is coupled to circuit node 242 and a second terminal of resistor 244 is coupled to VSS. Node 242 provides a reference leakage current, also referred to as a target leakage current, TGT_LKG, to an inverting input of comparator 246.

In operation, current source 240 is set to provide a target leakage current used to determine when to lower VBB. In operation, when ACT_LKG is greater than TGT_LKG, the output of comparator 246 is asserted which results in current source 250 being decoupled from output node 260 via open switch 252 (controlled by the output of inverter 248), negative pump 258 being coupled to output node 260 via closed switch 254 (controlled by the output of comparator 246), and pump clock 256 being enabled. While pump clock 256 is enabled, the pump clock is provided to negative pump 258 which slowly pumps VBB down in accordance with the pump clock. In this configuration, the pull-up path from output node 260 to VDD is disabled. However, when ACT_LKG is less than TGT_LKG, the output of comparator 246 is negated which results in disabling pump clock 256, opening switch 254 to decouple negative pump 258 from well bias node 260, and enabling the pull-up path for VBB by closing switch 252.

Therefore, when there is too much leakage in array 12 (i.e. greater than the target leakage), such as at high temperatures, VBB is pumped down below VSS thus providing a negative well bias to array 12 and reference array 218. The negative well bias reduces leakage during read operations, resulting in improved performance. However, when there is little to no leakage in array 12 (i.e. less than the target leakage), such as at cold temperatures, VBB is again pulled up. If little or no leakage is present and yet a negative well bias (below VSS) is still provided to the wells of array 12, write performance would be negatively impacted due to reduced drive strength of the bit cell for the write current, possibly resulting in increased write failures. However, by monitoring the leakage current, a negative well bias can be selectively applied as needed.

Referring to FIG. 2, note that leakage current measuring circuit 202 provides a first feedback look to measure the leakage current and provide ACT_LKG, while well voltage bias circuit 204 provides a second feedback loop which uses an output of the first feedback loop. In general, the feedback loop of circuit 204 operates slower than the feedback loop of 202. With FDSOI technology, the wells of array 12 act as a large capacitor, therefore, when VBB is pumped down or pulled up, VBB changes slowly. In this manner, after each change in voltage of VBB, the feedback loops are given time to stabilize. Therefore, with these slow changes, an equilibrium well bias voltage can be reached allowing for a stable system which operates at a stable operating point.

Figure 3:
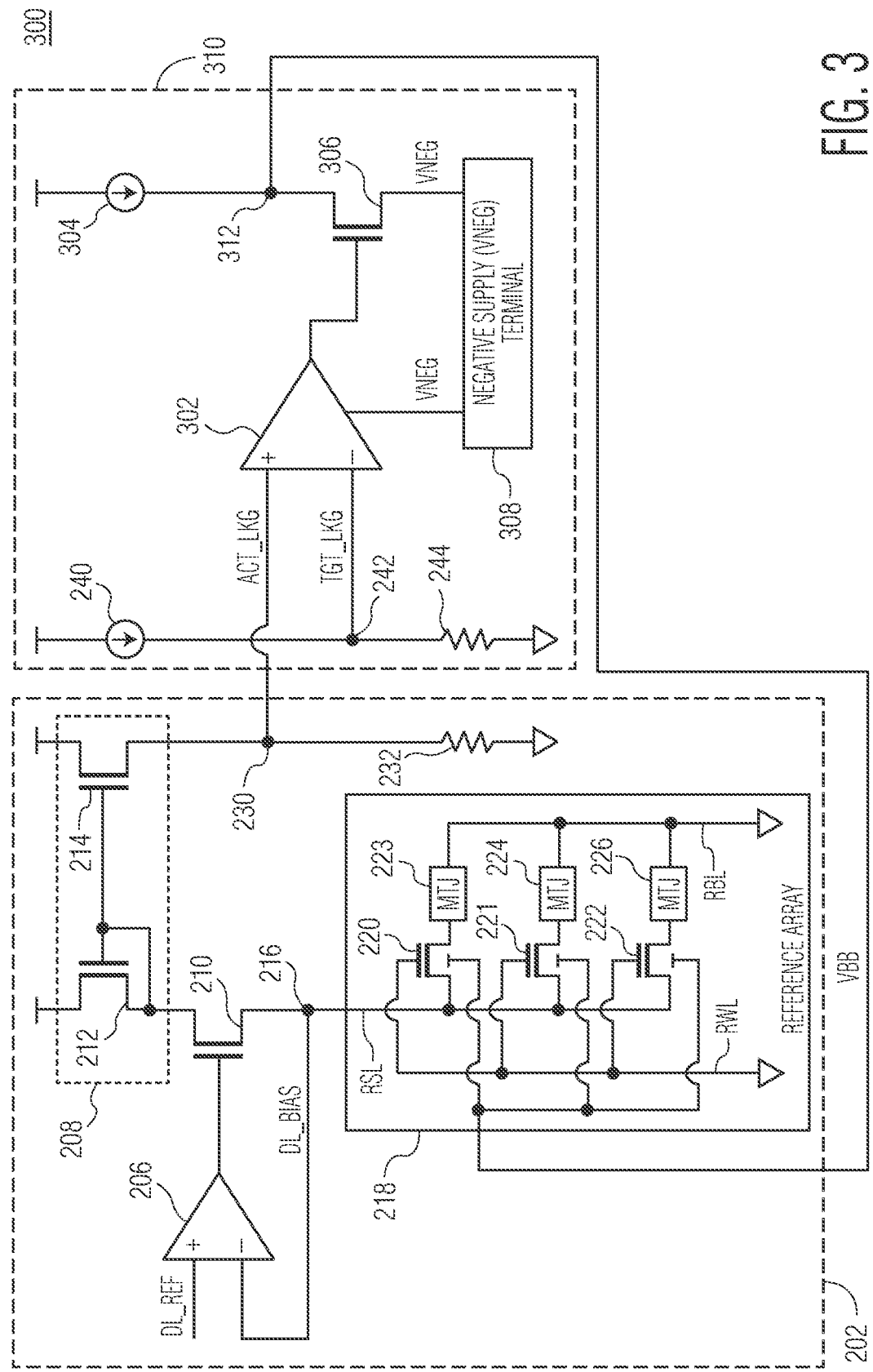
FIG. 3 is a circuit diagram of an alternate embodiment of the well bias generation circuit of FIG. 1, according to one embodiment of the present invention.

FIG. 3 illustrates, in partial block diagram form and partial schematic form, a more detailed view of well bias generation circuit 18 in accordance with another embodiment, in which like numerals indicate like references. Circuit 18 includes leakage current measurement circuit 202 coupled to a well voltage bias circuit 310. Leakage current measurement circuit 202 was fully described above in reference to FIG. 2 and those descriptions apply to FIG. 3 as well. Similarly, current source 240, circuit node 242, and resistor 244 are the same as in FIG. 2. Well voltage bias circuit 310 includes an analog amplifier 302, a current source 304, an NMOS transistor 306, and a negative voltage terminal which provides a negative supply voltage VNEG which is less than VSS. In one embodiment, it is −1.5V. Amplifier 302 has a non-inverting input coupled to receive ACT_LKG from circuit 202, an inverting input coupled to node 242 to receive TGT_LKG and an output coupled to a control electrode of transistor 306. The power rails of amplifier 302 are provided by VDD and VNEG (rather than VSS). A first terminal of current source 304 is coupled to VDD and a second terminal is coupled to a first current electrode of transistor 306. A second current electrode of transistor 306 is coupled to VNEG. Output circuit node 312, at the second terminal of current source 304 and the first current electrode of transistor 306, provides VBB, which is fed back to leakage current measurement circuit 202.

In operation, transistor 306 is configured as a common source amplifier driven by operational amplifier 302, which regulates VBB within a range of VNEG to VDD based on the measured leakage current. The output of amplifier 302 controls transistor 306. While ACT_LKG is greater than TGT_LKG, the output of amplifier 302 is pulled up towards VDD which results in pulling down VBB towards VNEG, and while ACT_LKG is less than TGT_LKG, the output of amplifier 302 is pulled down towards VNEG which results in pulling up VBB. This continuously occurs until ACT_LKG matches TGT_LKG. By controlling transistor 306, VBB is adjusted based on the relationship between ACT_LKG and TGT_LKG. As with circuit 204 of FIG. 2, circuit 310 also operates as a feedback loop, but in this embodiment, both the feedback loops of circuit 202 and circuit 310 are continuous loops which are always on, therefore, contention between the two feedback loops may be an issue. However, note that the illustrated embodiment also allows for the adjustment of VBB based on the measured leakage current of array 12 such that VBB is not pulled to VNEG when there is little to no leakage.

Therefore, by now it can be appreciated how, through the use of two feedback loops, one implementing a leakage current measure circuit and the other a well voltage bias circuit, a well bias voltage of a memory array can be adjusted, as needed, in response to the measured leakage current of the array. In this manner, a negative well voltage bias may be applied to improve read operation when leakage current is present, especially at higher temperatures, but may be pulled up in the situation when little to no leakage is present, such as at colder temperatures. This adjustment in well bias voltage may allow for improved performance of both reads and writes over a wide range of temperatures.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) preceding or following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a circuit includes a leakage current measuring circuit and a well voltage bias circuit. The leakage current measuring circuit includes: a first circuit including a bias input node and a well bias node; a bias input node control circuit, the bias input node control circuit including a first input to receive an indication of a reference voltage, a second input to receive an indication of a voltage of the bias input node, and an output to bias the bias input node at the reference voltage based on a relationship between the first input and the second input; and an output to provide a signal indicative of a leakage current of the first circuit through the bias input node. The well voltage bias circuit includes an output bias node for providing a well bias voltage; and a well bias control circuit including a first input to receive the signal indicative of the leakage current, a second input to receive a signal indicative of a reference leakage current value, and an output for controlling the well bias voltage at the output bias node based on a relationship between the first input and the second input of the well bias control circuit, wherein the well bias node is coupled to the output bias node to receive the well bias voltage. In one aspect of this embodiment, the circuit further includes a memory array circuit including a plurality of memory cells, a plurality of transistors, and an array well bias input coupled to the output bias node to receive the well bias voltage to bias a well of the memory array. In a further aspect, the first circuit is a reference circuit configured to emulate a leakage current of the memory array. In another aspect of this embodiment, the well bias control circuit includes a voltage comparator that compares a voltage of the first input of the well bias control circuit with a voltage of the second input of the well bias control circuit and provides an output that is indicative of which voltage is greater. In a further aspect, the well bias circuit includes a negative charge pump circuit that pulls the well bias voltage towards a negative voltage when the leakage current as indicated by the signal indicative of leakage current is greater than the reference leakage current value as indicated by the signal indicative of the reference leakage current value. In yet a further aspect, the well bias circuit pulls the well bias voltage higher when the leakage current as indicated by the signal indicative of leakage current is less than the reference leakage current value as indicated by the signal indicative of the reference leakage current value. In another aspect of this embodiment, the well bias circuit includes a pull up circuit that pulls up the well bias voltage when the leakage current as indicated by the signal indicative of the leakage current is less than the reference leakage current value as indicated by the signal indicative of the reference leakage current value. In another aspect, the well bias circuit includes a negative voltage terminal and a control transistor including a first current terminal coupled to the well bias node, a second current terminal coupled to the negative voltage terminal, and a control terminal, wherein the well bias control circuit includes an amplifier including an output for controlling the control terminal of the transistor and a low voltage supply rail biased by the negative voltage terminal, the amplifier including a first input to receive the signal indicative of the leakage current and a second input to receive the signal indicative of a reference leakage current value. In another aspect, the circuit further includes a memory array including a plurality of memory cells; a plurality of sense amplifiers for reading values stored in the plurality of memory cells; wherein the reference voltage is indicative of a voltage provided to a reference input of a sense amplifier of the plurality of sense amplifiers that is compared to a data input of the sense amplifier to determine a stored value in a data cell during a read operation.

In another embodiment, a method includes biasing a node of a path of a first circuit with a node bias circuit at a reference voltage with a control circuit including a first input to receive a signal indicative of the voltage of the node of the path and a second input to receive a second signal indicative of the reference voltage; providing a signal indicative of a leakage current through the node of the path; controlling a well bias voltage based on a relationship between the signal indicative of the leakage current and a signal indicative of a reference leakage current; and biasing a well of the first circuit with the well bias voltage. In one aspect of the another embodiment, the method further includes biasing a well of a memory array with the well bias voltage, the memory array including a plurality of memory cells. In a further aspect, the memory array is of a memory that includes a plurality of sense amplifiers for reading values stored in the plurality of memory cells, wherein the reference voltage is indicative of a voltage provided to a reference input of a sense amplifier of the plurality for comparing against a data input of the sense amplifier of the plurality of sense amplifiers for determining a value stored in a memory cell of the plurality of memory cells during a read operation. In another further aspect, the first circuit is a reference circuit configured to emulate a leakage current of the memory array. In another aspect of the another embodiment, the controlling the well bias voltage based on a relationship between the signal indicative of the leakage current and the signal indicative of the reference leakage current includes lowering the well bias voltage when the leakage current as indicated by the signal indicative of the leakage current is greater than the reference leakage current as indicated by the signal indicative of the reference leakage current. In a further aspect, the well biased voltage is lowered with a negative charge pump. In another aspect, the controlling a well bias voltage based on a relationship between the signal indicative of the leakage current and the signal indicative of the reference leakage current includes raising the well bias voltage when the leakage current as indicated by the signal indicative of the leakage current is less than the reference leakage current as indicated by the signal indicative of the reference leakage current. In a further aspect, the well bias voltage is raised with a pull up current source.

In yet another embodiment, a circuit includes a leakage current measuring circuit, a well voltage bias circuit, and a memory array circuit. The leakage current measuring circuit includes a first circuit including bias input node and a well bias node; a bias input node control circuit, the bias input node control circuit including a first input to receive an indication of a reference voltage, a second input to receive an indication of a voltage of the bias input node, and an output to bias the bias input node at the reference voltage based on a relationship between the first input and the second input; and an output to provide a signal indicative of a leakage current of the first circuit through the bias input node. The well voltage bias circuit includes an output bias node for providing a well bias voltage; a well bias control circuit including a first input to receive the signal indicative of the leakage current, a second input to receive a signal indicative of a reference leakage current value; and an output for controlling the well bias voltage at an output bias node based on a relationship between the first input and the second input of the well bias control circuit. The memory array circuit includes a plurality of memory cells, a plurality of transistors, and an array well bias input coupled to the output bias node to receive the well bias voltage to bias a well of the memory array, wherein the first circuit is a reference circuit configured to emulate a leakage current of the memory array. In one aspect, the circuit further includes a plurality of sense amplifiers for reading values stored in the plurality of memory cells, wherein the reference voltage is indicative of a voltage provided to a reference input of the sense amplifier of the plurality of sense amplifiers that is compared to a data input of the sense amplifier to determine a stored value in a data cell during a read operation. In another aspect, the bias input node is part of a current path in the first circuit that emulates a source line of the memory array.

What is claimed is:

1. A circuit comprising:
   a leakage current measuring circuit including:
      a first circuit including a bias input node and a well bias node;
      a bias input node control circuit, the bias input node control circuit including a first input to receive an indication of a reference voltage, a second input to receive an indication of a voltage of the bias input node, and an output to bias the bias input node at the reference voltage based on a relationship between the first input and the second input;
      an output to provide a signal indicative of a leakage current of the first circuit through the bias input node;
   a well voltage bias circuit including:
      an output bias node for providing a well bias voltage;
      a well bias control circuit including a first input to receive the signal indicative of the leakage current, a second input to receive a signal indicative of a reference leakage current value, and an output for controlling the well bias voltage at the output bias node based on a relationship between the first input of the well bias control circuit and the second input of the well bias control circuit;
      wherein the well bias node is coupled to the output bias node to receive the well bias voltage.

2. The circuit of claim 1 further comprising:
   a memory array circuit including a plurality of memory cells, a plurality of transistors, and an array well bias input coupled to the output bias node to receive the well bias voltage to bias a well of the memory array.

3. The circuit of claim 2 wherein the first circuit is a reference circuit configured to emulate a leakage current of the memory array.

4. The circuit of claim 1 wherein the well bias control circuit includes a voltage comparator that compares a voltage of the first input of the well bias control circuit with a voltage of the second input of the well bias control circuit and provides an output that is indicative of which voltage is greater.

5. The circuit of claim 4 wherein the well voltage bias circuit includes a negative charge pump circuit that pulls the well bias voltage towards a negative voltage when the leakage current as indicated by the signal indicative of the leakage current is greater than the reference leakage current value as indicated by the signal indicative of the reference leakage current value.

6. The circuit of claim 5 wherein the well voltage bias circuit pulls the well bias voltage higher when the leakage current as indicated by the signal indicative of the leakage current is less than the reference leakage current value as indicated by the signal indicative of the reference leakage current value.

7. The circuit of claim 1 wherein the well voltage bias circuit includes a pull up circuit that pulls up the well bias voltage when the leakage current as indicated by the signal indicative of the leakage current is less than the reference leakage current value as indicated by the signal indicative of the reference leakage current value.

8. The circuit of claim 1 wherein the well voltage bias circuit includes a negative voltage terminal and a control transistor including a first current terminal coupled to the well bias node, a second current terminal coupled to the negative voltage terminal, and a control terminal, wherein the well bias control circuit includes an amplifier including an output for controlling the control terminal of the transistor and a low voltage supply rail biased by the negative voltage terminal, the amplifier including a first input to receive the signal indicative of the leakage current and a second input to receive the signal indicative of a reference leakage current value.

9. The circuit of claim 1 further comprising:
   a memory array including a plurality of memory cells;
   a plurality of sense amplifiers for reading values stored in the plurality of memory cells
   wherein the reference voltage is indicative of a voltage provided to a reference input of a sense amplifier of the plurality of sense amplifiers that is compared to a data input of the sense amplifier to determine a stored value in a memory cell of the plurality of memory cells during a read operation.

10. A method comprising:
    biasing a node of a first circuit at a reference voltage with a control circuit, the control circuit including a first input to receive a signal indicative of a voltage of the node and a second input to receive a second signal indicative of the reference voltage;
    providing a signal indicative of a leakage current through the node;
    controlling a well bias voltage based on a relationship between the signal indicative of the leakage current and a signal indicative of a reference leakage current;
    biasing a well of the first circuit with the well bias voltage.

11. The method of claim 10 further comprising:
    biasing a well of a memory array with the well bias voltage, the memory array including a plurality of memory cells.

12. The method of claim 11 wherein the memory array is of a memory that includes a plurality of sense amplifiers for reading values stored in the plurality of memory cells, wherein the reference voltage is indicative of a voltage provided to a reference input of a sense amplifier of the plurality of sense amplifiers for comparing against a data input of the sense amplifier of the plurality of sense amplifiers for determining a value stored in a memory cell of the plurality of memory cells during a read operation.

13. The method of claim 11 wherein the first circuit is a reference circuit configured to emulate a leakage current of the memory array.

14. The circuit of claim 11 wherein the controlling a well bias voltage based on a relationship between the signal indicative of the leakage current and the signal indicative of the reference leakage current includes raising the well bias voltage when the leakage current as indicated by the signal indicative of the leakage current is less than the reference leakage current as indicated by the signal indicative of the reference leakage current.

15. The circuit of claim 14 wherein the well bias voltage is raised with a pull up current source.

16. The method of claim 10 wherein the controlling the well bias voltage based on the relationship between the signal indicative of the leakage current and the signal indicative of the reference leakage current includes lowering the well bias voltage when the leakage current as indicated by the signal indicative of the leakage current is greater than the reference leakage current as indicated by the signal indicative of the reference leakage current.

17. The circuit of claim 16 wherein the well biased voltage is lowered with a negative charge pump.

18. A circuit comprising:
a leakage current measuring circuit including:
  a first circuit including bias input node and a well bias node;
  a bias input node control circuit, the bias input node control circuit including a first input to receive an indication of a reference voltage, a second input to receive an indication of a voltage of the bias input node, and an output to bias the bias input node at the reference voltage based on a relationship between the first input and the second input; and
  an output to provide a signal indicative of a leakage current of the first circuit through the bias input node;
a well voltage bias circuit including:
  an output bias node for providing a well bias voltage; and
  a well bias control circuit including a first input to receive the signal indicative of the leakage current, a second input to receive a signal indicative of a reference leakage current value, and an output for controlling the well bias voltage at the output bias node based on a relationship between the first input of the well bias control circuit and the second input of the well bias control circuit; and
a memory array circuit including a plurality of memory cells, a plurality of transistors, and an array well bias input coupled to the output bias node to receive the well bias voltage to bias a well of the memory array, wherein the first circuit is a reference circuit configured to emulate a leakage current of the memory array.

19. The circuit of claim 18 further comprising:
a plurality of sense amplifiers for reading values stored in the plurality of memory cells
wherein the reference voltage is indicative of a voltage provided to a reference input of a sense amplifier of the plurality of sense amplifiers that is compared to a data input of the sense amplifier of the plurality of sense amplifiers to determine a stored value in a memory cell of the plurality of memory cells during a read operation.

20. The circuit of claim 18 wherein the bias input node is part of a current path in the first circuit that emulates a source line of the memory array.

* * * * *